US006684653B2

(12) United States Patent
Des Champs et al.

(10) Patent No.: US 6,684,653 B2
(45) Date of Patent: Feb. 3, 2004

(54) AIR-CONDITIONER AND AIR-TO-AIR HEAT EXCHANGE FOR CLOSED LOOP COOLING

(76) Inventors: Nicholas H. Des Champs, 3095 Brughs Mill Rd., Fincastle, VA (US) 24090; Benjamin R. Tritt, 505 N. Woods Ct., Salem, VA (US) 24153

( * ) Notice: Subject to any disclaimer, the term of this patent is extended or adjusted under 35 U.S.C. 154(b) by 0 days.

(21) Appl. No.: 09/989,008

(22) Filed: Nov. 21, 2001

(65) Prior Publication Data

US 2003/0094006 A1 May 22, 2003

(51) Int. Cl.[7] .................. F25D 17/04; F25D 17/00; F25D 21/06; F25D 17/06; F25B 29/00
(52) U.S. Cl. ................ 62/186; 62/89; 62/129; 62/151; 62/180; 62/187; 62/409; 165/250
(58) Field of Search .................. 62/186, 129, 151, 62/89, 187, 180, 409, 412, 427; 165/250

(56) References Cited

U.S. PATENT DOCUMENTS

| | | | |
|---|---|---|---|
| RE22,584 E | | 12/1944 | Terry et al. |
| 2,489,009 A | | 11/1949 | Corhanidis |
| 3,826,105 A | * | 7/1974 | Marsteller .................. 454/239 |
| 3,831,395 A | * | 8/1974 | Levy ............................ 165/53 |
| 3,977,466 A | * | 8/1976 | Johansson .................. 165/285 |
| 4,389,853 A | * | 6/1983 | Hile ............................ 165/251 |
| 4,524,588 A | * | 6/1985 | Bond ............................ 62/262 |
| 4,562,955 A | * | 1/1986 | Horster et al. .................. 165/4 |
| 4,952,283 A | * | 8/1990 | Besik ............................ 165/4 |
| 5,193,610 A | * | 3/1993 | Morissette et al. .......... 165/166 |
| 5,239,834 A | | 8/1993 | Travers |
| 5,295,531 A | * | 3/1994 | Tsunekawa et al. .......... 165/48.1 |
| 5,372,189 A | * | 12/1994 | Tsunekawa et al. .......... 165/59 |
| 5,447,037 A | * | 9/1995 | Bishop et al. .............. 165/251 |
| 6,209,622 B1 | * | 4/2001 | Lagace et al. ................. 165/54 |

* cited by examiner

Primary Examiner—William C. Doerrler
Assistant Examiner—Filip Zec
(74) Attorney, Agent, or Firm—Clyde I. Coughenour

(57) ABSTRACT

Closed loop cooling is provided by means of a mechanical air conditioner combined with an air-to-air heat exchanger. Three basic modes of operation maximize cooling while minimizing energy consumption, depending on ambient air temperature. In the first mode the air-to-air heat exchanger or economizer provides all required cooling to a closed circuit enclosure air stream, transferring heat to the cold ambient air stream. In the second mode the air-to-air heat exchanger precools the closed air circuit stream using moderate temperature ambient air, in the same manner as in the first mode, followed by further removal of heat by passing enclosure air through refrigeration condenser coils. The heat taken in at the evaporator is transferred to the ambient air stream as it passes through a condenser coil after passing through the heat exchanger. In the third mode, only the mechanical air conditioner provides cooling, transferring heat from the closed circuit enclosure air stream to the evaporator after which it is transferred in the condenser to ambient hot air that does not pass through the air-to-air heat exchanger. A fourth heating mode can be employed if necessary under extremely cold conditions. A system of dampers and controls provides the alternate modes of cooling.

19 Claims, 1 Drawing Sheet

AIR-CONDITIONER AND AIR-TO-AIR HEAT EXCHANGE FOR CLOSED LOOP COOLING

BACKGROUND OF THE INVENTION

1. Field of the Invention

An enclosure is cooled by a compact, efficient refrigeration system incorporating an air-to-air heat exchange economizer.

2. Description of Related Art

There are numerous manufacturers of mechanical, refrigeration based air conditioners and numerous manufacturers of air-to-air heat exchangers. Both types of equipment are applied for the cooling of shelters, cabinets or enclosures, which often contain electronic equipment, or other heat generating devices that do not require, nor desire, ventilation air. The introduction of ventilation air, or outside air, directly into the enclosure is actually undesirable because of contaminants. Each method of cooling has limitations. Both type devices use closed loop systems, by which the recirculating air inside the enclosure never comes in contact with outside air during cooling, thus eliminating the potential for contamination of the electronics, or other sensitive materials, inside the heat generating equipment enclosure. An air-to-air heat exchanger is a device that transfers energy from one air-stream to another, without actual mixing of or contact between the two airstreams. Air-to-air heat exchangers can be a plate type, rotary type or heat pipe type. For systems requiring closed loop cooling, the rotary type heat exchanger is not used because of the difficulty in insuring that there is no leakage between air streams. For purposes of the present invention, only air-to-air heat exchangers, that are "sensible" heat transfer devices, are considered, because they transfer heat without transferring moisture or contaminants.

It is common for the heat load inside an enclosure to be high enough to require some cooling for the majority of the year. Depending on the desired internal enclosure temperature, a particular cooling system will be selected. For internal temperatures lower than the warmest ambient temperatures, a mechanical air conditioner is used. If internal temperatures are allowed to be higher than ambient, it is possible to use an air-to-air heat exchanger. It is also common practice to install a mechanical air conditioner in parallel with an air-to-air heat exchanger. In this way, the air-to-air exchanger can operate when the ambient temperatures are sufficiently lower than the desired internal temperature to achieve the desired cooling. When the ambient temperature is too warm for the heat exchanger to achieve all required cooling, or when the ambient temperature is higher than the desired internal temperature, a mechanical air conditioner will operate.

The use of outside ambient air as a heating/cooling means is common. The provision of alternate flow paths through air conditioning units for cooling, ventilation, exhaust and tempered ventilations is old with Terry et al, U.S. Pat. No. Re 22,584, issued Dec. 26, 1944, an example.

It is old in the art to combine a refrigeration unit and an air heat exchanger to improve efficiency. With occupied dwellings, ambient air is introduced into the dwelling as fresh air and stale dwelling air is exhausted. The patent to Bishop et al, U.S. Pat. No. 5,447,037, issued Sep. 5, 1995, is an example of such use with the controls that can be incorporated.

The patent to R. Travers, U.S. Pat. No. 5,239,834, issued Aug. 31, 1993, is an example of a refrigeration unit used in parallel with an air-to-air heat exchanger for temperature control of an enclosure. Both the exchange of ambient air with enclosure air and prevention of air exchange are disclosed. The primary concern is for temperature control of perishable and/or consumable food products. It is desirable to prevent contaminated ambient air from entering the enclosure. Contamination of the enclosure air is prevented by use of an air-to-air heat exchanger in parallel with a refrigeration/air conditioning unit.

SUMMARY OF THE INVENTION

The present invention combines and integrates a mechanical air conditioning system and an air-to-air heat exchanger or economizer. The unique combination of the two systems allows for three modes of operation depending on the difference between ambient air temperature and desired enclosure internal air temperatures with a fourth mode available for extremely cold ambient temperature. A system of dampers and controls determine which operating mode is employed.

Enclosure air takes the same path through the cooling unit, heat exchanger and refrigerant unit and heater, regardless of ambient air temperature. During periods when ambient air temperatures are low, cooling of enclosure air is by air-to-air heat exchange with the refrigeration unit idle. Enclosure air flows through the air-to-air heat exchanger with heat transfer taking place as ambient air is passed through the heat exchanger. Sensible energy is transferred from the warmer air stream to the cooler air stream, whereby the warm entering enclosure air stream is cooled, and the cooler ambient air stream is heated. When applied to enclosures housing electronic equipment, the warmer enclosure interior air path is cooled based on the outside temperature. It is impossible to cool the interior air stream below the ambient temperature with only an air-to-air heat exchanger, unless special indirect cooling methods are used which involve complicated systems.

When ambient air temperatures are cooler than desired maximum enclosure temperatures, but warmer than desired enclosure minimum temperatures, refrigeration is employed concurrently with the air-to-air heat exchange. The ambient air is used to absorb heat, first from the enclosure air stream, followed by a second absorption of heat from the refrigeration condenser.

When ambient air temperatures are higher than enclosure maximum air temperature, cooling is by the refrigeration unit alone. No ambient outside air is passed through the air-to-air heat exchanger but is passed only through the condenser of the refrigeration unit to indirectly remove heat from the enclosure air stream.

Extremely low ambient air temperatures may require heating of the enclosure air.

BRIEF DESCRIPTION OF THE DRAWING

The drawing FIGURE is a schematic representation of the arrangement of the components of the invention disclosing air flow paths.

DESCRIPTION OF THE PREFERRED EMBODIMENT

Figure 1:
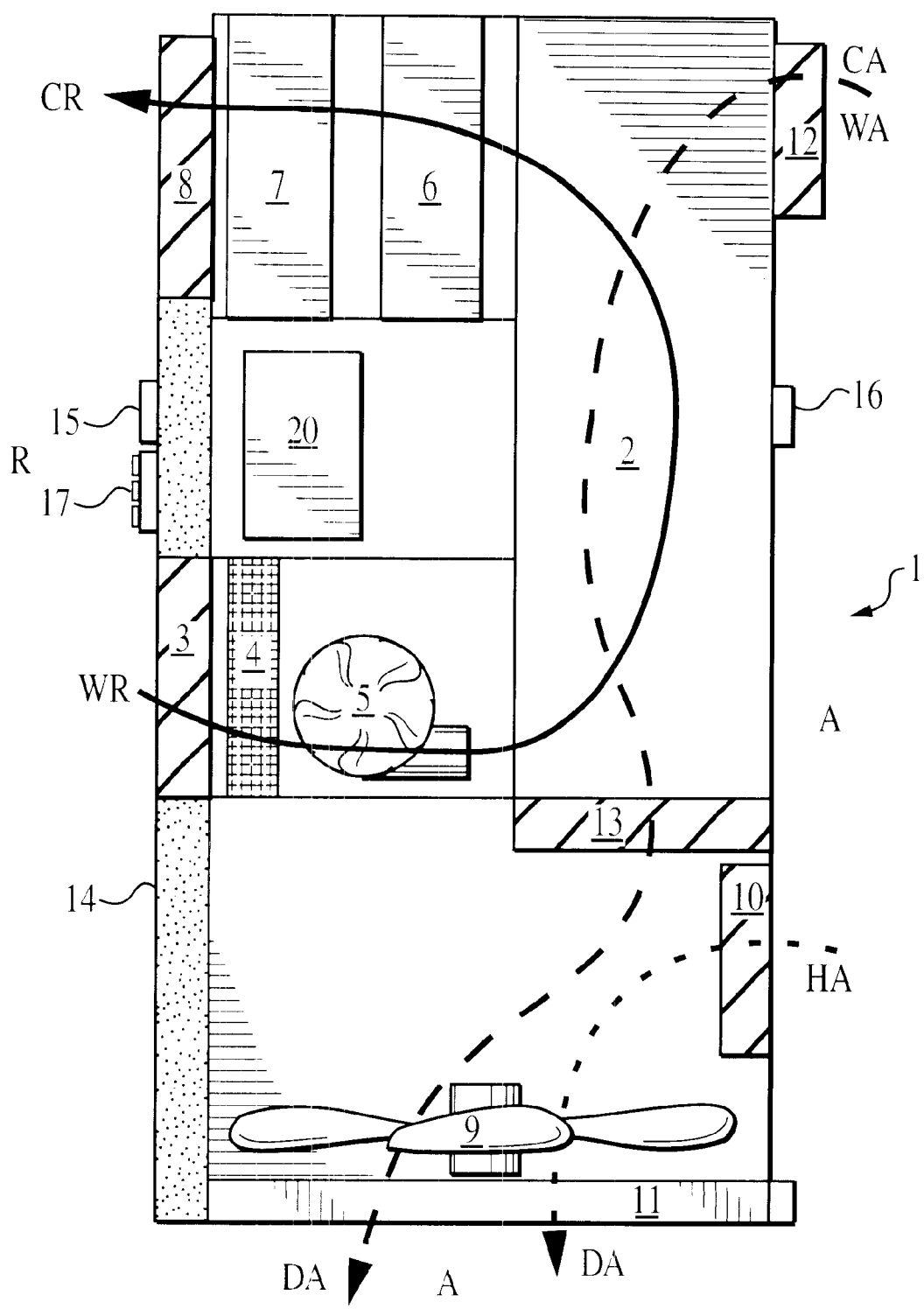

The drawing is a schematic showing of a standard type air conditioning or refrigeration unit combined with a heat exchanger, modified according to the teachings of the present invention. The alternate air flow paths are depicted by various style lines. The combined cooling unit 1 includes an air-to-air heat exchanger or economizer 2 in close proximity to or as a part of air conditioning or refrigeration unit components for cooling enclosure or room air R. The unit is shown outside a room or enclosure wall 14. These components include a room or enclosure air moving fan 5 that draws warm room air WR through a room air exit duct 3 past a filter 4 and then forces the warm room air through the heat exchanger 2, through an evaporator cooling coil 6, heater 7 and room air inlet duct 8. The air is discharged back into the room as cooled room air CR. This enclosure room air flow path remains the same irrespective of ambient air conditions. The room air exit duct 3 and the inlet air duct 8 may be provided with dampers, but dampers are not considered necessary at these locations. The ambient air flow path depends on ambient air A temperature. The ambient air is moved by the ambient air fan 9. If the ambient air is hotter than the desired enclosure room air temperature, the ambient air fan 9 draws in the hot ambient air HA through an outside hot air damper 10 and forces it over and through the condenser coil 11 and back to the outside as discharge ambient air DA along the flow path HA-DA. If the ambient air is cold or warm, but below the maximum temperature for room air, the ambient air fan 9 draws the cold ambient air CA or warm ambient air WA through the cool outside air damper 12, through the air-to-air heat exchanger 2, through the heat exchange damper 13, and forces it back out past the condenser coil 11 as discharge ambient air DA. The flow path is CA/WA-DA. Either the cool outside air damper 12 or the heat exchange damper 13 may simply have a duct for conducting air, but one of the two must have a damper.

The main control unit 17 for the apparatus is responsive to temperature sensors that operate the elements of the apparatus depending on manual or built in settings controlled by enclosed room air temperature and ambient outside air temperature. There is no concern for humidity as the enclosures generally are not occupied and only the actual temperature is of concern. The primary operating input to the main control is by a first sensor 15, that indicates the temperature within the enclosure. The first sensor 15 directly or indirectly controls all "nonstatic" components of the apparatus. The secondary control is a second sensor 16 used to sense the temperature of the ambient air.

The first mode of operation takes place when the enclosure becomes warm and the ambient air temperature is somewhat colder than the enclosure minimum set air temperature. The main control device is influenced primarily by the first sensor 15, for the temperature within the enclosure, and a secondary sensor 16, used to sense the temperature of ambient air.

When the enclosure air R temperature equals or exceeds a set value, i.e. the maximum permitted enclosure temperature, as programmed into the main control unit 17 and indicated by the primary first sensor 15, the main control device 17 activates the motors that operate the warm room air exit damper 3, if one is present, and the room inlet air damper 8, if one is present, to open the ducts, and the room air recirculation fan 5 with or without a delay. This damper operation is not necessary if dampers are not used as the fan simply draws air through the exit duct 3 and discharges it through the inlet air duct 8. This causes the air to flow in a closed path that is the same regardless of the cooling unit operating mode and outside ambient air temperature. The enclosure air flows through the enclosure exit air duct 3, the filter 4, enclosure recirculating fan 5, air-to-air heat exchanger 2, evaporator coil 6, heater 7, and back into the enclosure through air inlet duct 8. The heater 7 is an optional device used for winter time heating and is shown primarily for reference purposes.

The first mode of operation takes place when the second ambient air sensor 16 indicates that the ambient air temperature is cooler or less than that of the desired enclosure air minimum set temperature, as determined by the control device 17. With or after activation of the enclosure air flow path elements, the main control device activates the motors that operate the cool outside air damper 12 and the heat exchange damper 13, to open them, and activates the ambient air circulation fan 9. The cool ambient air CA flows through the outside air damper 12, the air-to-air heat exchanger 2, the heat exchange damper 13, past the ambient air fan 9 and through the condenser coil 11, back to the outside as discharge ambient air DA. During this first mode of operation, the compressor 20, evaporator coil 6, heater 7 and condenser coil 11 are inactive and the hot outside air damper 10 is closed. The only heat exchange is that taking place in the air-to-air heat exchanger 2 where heat from the enclosure air is transferred to the cool ambient air as the air flows through its respective paths that are isolated from each other.

The second mode of operation takes place when the enclosure air becomes warm and the ambient air temperature is cooler than the enclosure air temperature, but not cold enough to bring the enclosure air temperature down to its operating or minimum set temperature. This generally takes place when the ambient air temperature is from a few degrees below minimum up to a few degrees below maximum acceptable enclosure temperature as set or programmed into the main control unit. For this second mode, the enclosure air circulation path is the same as in the first mode, as are the controls for it, and the warm ambient air flow path is the same as in the first mode, as are the controls for it. In the second mode, however, the main control device activates the refrigeration system to assist the heat transfer taking place in the air-to-air heat exchanger.

The standard refrigeration cycle can be employed. There are many variations and additional options that can be used in a cooling system. However, for the purposes of this description, an understanding of the basic operation is sufficient. Various popular refrigerants can be used. The system routinely uses both a high-pressure switch and low-pressure switch. The high pressure switch is set around 400 psi and is mounted on the compressor discharge line. The low pressure switch is set around 40 psi and is mounted on the compressor suction line. The low-pressure switch is automatically reset, but the high-pressure switch normally has a manual reset. At startup during low ambient temperature conditions, the pressure will often be below the low pressure switch set point for a minute or two, so a timed bypass switch is used to bypass the low-pressure switch. When the refrigerant compressor 20 is activated, the compressor changes the low pressure gaseous refrigerant into a high pressure hot refrigerant gas. In turn the gas flows through the condenser. With these coils functioning, the ambient warm air WA, after absorbing heat in the air-to-air heat exchanger, absorbs more heat as it flows over the condenser coils 11 condensing the high pressure hot gas refrigerant into the high pressure liquid state within the condenser coils, before being discharged back to ambient outside DA. After the refrigerant is liquified in the condenser coil 11, it is transported to the evaporator coil 6, converted by expansion from a high pressure liquid to primarily a low pressure low temperature liquid that is vaporized into a low pressure gas as it absorbs heat from the recirculated enclosure air passing through the evaporator coil 6. In this second mode of operation, the heat exchanger and refrigeration system combine to cool the warm enclosure air WR, that is discharged back into the room as cooled room air CR.

The third mode of operation takes place when the enclosure becomes warm and the ambient air temperature is essentially the same as, or higher than, that of the enclosure air temperature. With these circumstances, the heat exchanger cannot be used to remove heat. As determined by the control device 17, the operation of the room air recirculation flow path and controls are the same as in the second mode, with the refrigeration compressor, condenser, and evaporator in operation. However, the ambient air circulation is modified so as to not pass hot ambient air through the heat exchanger. When the ambient air sensor 16 indicates that the ambient air temperature is essentially the same as, or higher than, that of the enclosure air temperature, the main control device 17 operates the damper motors to close one or both of the cool outside air damper 12 and/or heat exchange damper 13, if they are open, and opens the hot outside air damper 10. If a simple duct is used in place of the cool outside air damper 12 or the heat exchange damper 13, only the damper is of concern and must be closed to prevent ambient air flowing through the air-to-air heat exchanger. This prevents the flow of ambient air through flow-paths CA-DA, WA-DA of the heat exchanger, so that the ambient air circulation fan draws the hot ambient air HA through the hot outside air damper 10, past the ambient air fan 9 and through the condenser coil to liquify the high pressure refrigerant in the condenser coils. The entire cooling load is carried by the refrigeration system, with the heat being removed by the ambient air flow through the condenser coils.

In the event an extremely low ambient temperature is encountered, as indicated by the second sensor 16, an optional fourth mode can be employed. The enclosure air can be heated by activating the heater 7. As the enclosure is being heated by the equipment or components it contains, there is seldom need for heating the enclosure air. However, if heating is necessary, the main control device 17 activates the heater 7 and the enclosure recirculation fan 5. Provision is usually made so that the heater 7 will only be activated if the fan 5 is operating, although a delay may be employed. The enclosure air path is the same as in the first three modes.

The ambient air circulation fan 9 will be inactive when heating of enclosure air is required.

It is to be understood that during operation, the standard use of manual switches, cooling set-points having additional "deadband" with time delays for motor start-up and/or turn-off, etc., can be used. For example, to avoid refrigeration compressor short cycling, a delay-on-make time delay switch can be used. The refrigeration cycle can override or control the compressor and/or ambient air circulation fan. When refrigerant pressure gets too low, it may be desirable to cut off power to the ambient air circulation fan, to increase the low side refrigerant pressure, etc.

It is believed that the construction, operation and advantages of this invention will be apparent to those skilled in the art. It is to be understood that the present disclosure is illustrative only and that changes, variations, substitutions, modifications and equivalents will be readily apparent to one skilled in the art and that such may be made without departing from the spirit of the invention as defined by the following claims.

What is claimed is:

1. An enclosure cooling system comprising:

a cooling unit having a compressor, a condenser, an evaporator, a fan for recirculating enclosure air, a fan for circulating ambient air, an air-to-air heat transfer economizer, and means for controlling air flow;

control means for operating said compressor, said fan for recirculating enclosure air, said fan for controlling ambient air and said means for controlling air flow;

said control means has a first sensor for sensing the air temperature within said enclosure and a second sensor for sensing the temperature of ambient air;

an enclosure air flow path from within said enclosure, past said fan for recirculating enclosure air, through said air-to-air heat transfer economizer, through said evaporator, and back into said enclosure;

an ambient air flow path independent from said enclosure air flow path from outside said cooling unit, through said cooling unit and back outside said cooling unit;

said means for controlling air flow has an enclosure inlet air damper and an enclosure outlet air damper;

said control means opens said enclosure inlet air damper and said enclosure outlet air damper whenever said first sensor for sensing air temperature within said enclosure indicates an enclosure air temperature at or above a maximum set temperature.

2. An enclosure cooling system as in claim 1 wherein:

said control means actuates said fan for circulating ambient air and said fan for recirculating enclosure air whenever said first sensor for sensing temperature within said enclosure indicates an enclosure temperature at or above a set maximum temperature and said second sensor for sensing ambient air temperature indicates ambient temperature to be below the maximum set enclosure air temperature.

3. An enclosure cooling system as in claim 1 wherein:

said means for controlling air flow has a cool outside air damper and a heat exchange damper;

said control means opens said cool outside air damper and said heat exchange damper whenever said first sensor indicates said enclosure air temperature to be at or above maximum set temperature and said second sensor indicates said ambient air temperature to be below enclosure set maximum temperature.

4. An enclosure cooling system as in claim 1 wherein:

said means for controlling air flow has a heat exchange damper;

said control means opens said heat exchange damper whenever said first sensor indicates said enclosure air temperature to be at or above maximum set temperature and said second sensor indicates said ambient air temperature to be below enclosure set maximum temperature;

said control means actuates said fan for circulating ambient air and said fan for recirculating enclosure air whenever said first sensor for sensing temperature within said enclosure indicates an enclosure temperature at or above a maximum set temperature and said second sensor for sensing ambient temperature indicates an ambient temperature below enclosure set maximum temperature.

5. An enclosure cooling system as in claim 4 wherein:

said ambient air flow path from outside said cooling unit includes a first ambient air flow path that passes through said air-to-air heat transfer economizer and said heat exchange damper.

6. An enclosure cooling system as in claim 1 wherein:

said control means activates said compressor whenever said second sensor for sensing ambient air temperature indicates an ambient air temperature at or above a set enclosure minimum air temperature.

7. An enclosure cooling system as in claim 1 wherein:

said means for controlling air flow has a hot ambient air damper;

said control means opens said hot ambient air damper whenever said ambient air temperature sensor indicates ambient air temperature to be at or above the enclosure air temperature set maximum temperature.

8. An enclosure cooling system as in claim 7 wherein:

said means for controlling air flow has a heat exchange damper;

said control means closes said heat exchange damper located between said air-to-air heat transfer economizer and said fan for circulating ambient air whenever said second sensor indicates ambient air temperature to be higher than the enclosure maximum set air temperature.

9. An enclosure cooling system comprising:

a cooling unit having a compressor, a condenser, an evaporator, a fan for recirculating enclosure air, a fan for circulating ambient air, an air-to-air heat transfer economizer, and means for controlling air flow;

control means for operating said compressor, said fan for recirculating enclosure air, said fan for controlling ambient air and said means for controlling air flow;

said control means has a first sensor for sensing the air temperature within said enclosure and a second sensor for sensing the temperature of ambient air;

an enclosure air flow path from within said enclosure, past said fan for recirculating enclosure air, through said air-to-air heat transfer economizer, through said evaporator, and back into said enclosure;

an ambient air flow path independent from said enclosure air flow path from outside said cooling unit, through said cooling unit and back outside said cooling unit;

a first ambient air flow path from outside said cooling unit passes through said air-to-air heat transfer economizer and past said fan for circulating ambient air before passing back outside said cooling unit.

10. An enclosure cooling system as in claim 9 wherein:

said control means opens a heat exchange damper located between said air-to-air heat transfer economizer and said ambient air circulation fan for circulating ambient air through said air-to-air heat economizer whenever said second sensor for sensing the temperature of the ambient air indicates ambient air temperature to be below enclosure set maximum air temperature.

11. An enclosure cooling system as in claim 9 wherein:

said control means opens a cool outside air damper and closes a hot outside air damper whenever said second sensor for sensing the ambient air temperature indicates an ambient air temperature to be below enclosure set maximum air temperature.

12. An enclosure cooling system as in claim 9 wherein:

said means for controlling air flow has a room inlet air duct and a room outlet air duct;

said control means activates said compressor and said fan for recirculating enclosure air whenever said first sensor for sensing temperature within said enclosure indicates an enclosure temperature at or above a maximum set temperature and said second sensor for sensing ambient air temperature indicates ambient air temperatures to be below said maximum enclosure set temperature but above said enclosure minimum set temperature;

said control means operates said fan for circulating ambient air whenever said first sensor for sensing temperature within said enclosure indicates an enclosure temperature at or above a set maximum temperature and said second sensor indicates ambient air temperature to be below said maximum set enclosure air temperature.

13. An enclosure cooling system as in claim 9 wherein:

said means for controlling air flow has a hot ambient air damper;

said control means opens said hot ambient air damper whenever said ambient air temperature sensor indicates ambient air temperature to be higher than enclosure air temperature set maximum temperature.

14. An enclosure cooling system comprising:

a cooling unit having a compressor, a condenser, an evaporator, a fan for recirculating enclosure air, a fan for circulating ambient air, an air-to-air heat transfer economizer, and means for controlling air flow;

control means for operating said compressor, said fan for recirculating enclosure air, said fan for controlling ambient air and said means for controlling air flow;

said control means has a first sensor for sensing the air temperature within said enclosure and a second sensor for sensing the temperature of ambient air;

an enclosure air flow path from within said enclosure, past said fan for recirculating enclosure air, through said air-to-air heat transfer economizer, through said evaporator, and back into said enclosure;

an ambient air flow path independent from said enclosure air flow path from outside said cooling unit, through said cooling unit and back outside said cooling unit, said cooling unit has a heater;

said enclosure air flow path from said enclosure passes through said heater before returning back into said enclosure;

said control means activates said heater whenever said first sensor indicates enclosure air temperature to be at or below a minimum set temperature and said second sensor indicates said ambient air temperature to be below the minimum set enclosure air temperature.

15. An enclosure cooling system as in claim 14 wherein:

said means for controlling air flow has an enclosure inlet air duct and an enclosure outlet air duct and a cool outside air damper and a heat exchange damper;

said control means closes said cool outside damper and said heat exchange damper whenever said first sensor indicates enclosure air temperature to be at or below the minimum set enclosure air temperature setting and said second sensor indicates ambient air temperature to be below the minimum set enclosure air temperature.

16. An enclosure cooling system as in claim 15 wherein:

said means for controlling air flow has a hot outside air damper;

said control means closes said hot outside air damper and inactivates said ambient air circulation fan whenever said first sensor indicates enclosure air temperature to be at or below minimum set temperature and said second sensor indicates said ambient air temperature to be below the minimum set enclosure air temperature.

17. An enclosure cooling system as in claim 14 wherein:

said control means activates said compressor whenever said first sensor for sensing temperature within said enclosure indicates said enclosure temperature to be at or above a maximum set temperature and said second sensor for sensing ambient temperature indicates ambient air temperature to be above the minimum set enclosure air temperature.

18. An enclosure cooling system as in claim 14 wherein:

said means for controlling air flow has a cool outside air damper;

said control means opens said cool outside air damper whenever said first sensor indicates said enclosure air temperature to be at or above maximum set temperature and said second sensor indicates said ambient air temperature to be below enclosure set maximum air temperature.

19. An enclosure cooling system as in claim 18 wherein:

said control means operates said compressor whenever said ambient air temperature sensor indicates the ambient air temperature to be essentially equal to or higher than said enclosure minimum set air temperature.

* * * * *